United States Patent
Zaban et al.

(10) Patent No.: US 9,064,985 B2
(45) Date of Patent: Jun. 23, 2015

(54) NICKEL-COBALT ALLOYS AS CURRENT COLLECTORS AND CONDUCTIVE INTERCONNECTS AND DEPOSITION THEREOF ON TRANSPARENT CONDUCTIVE OXIDES

(75) Inventors: Arie Zaban, Shoham (IL); Larissa Grinis, Rishon LeZion (IL)

(73) Assignee: BAR-ILAN UNIVERSITY, Ramat-Gan (IL)

( * ) Notice: Subject to any disclaimer, the term of this patent is extended or adjusted under 35 U.S.C. 154(b) by 520 days.

(21) Appl. No.: 12/513,222

(22) PCT Filed: Oct. 25, 2007

(86) PCT No.: PCT/IL2007/001298
§ 371 (c)(1),
(2), (4) Date: Jun. 3, 2009

(87) PCT Pub. No.: WO2008/053464
PCT Pub. Date: May 8, 2008

(65) Prior Publication Data
US 2010/0065101 A1    Mar. 18, 2010

(51) Int. Cl.
| | |
|---|---|
| *H01L 21/00* | (2006.01) |
| *C25D 3/30* | (2006.01) |
| *C25D 9/08* | (2006.01) |
| *C25D 11/00* | (2006.01) |
| *H01G 9/20* | (2006.01) |
| *H01L 31/18* | (2006.01) |
| *H01L 51/44* | (2006.01) |
| *H01L 31/0224* | (2006.01) |

(52) U.S. Cl.
CPC .......... *H01L 31/022425* (2013.01); *C25D 3/30* (2013.01); *C25D 9/08* (2013.01); *H01L 31/022466* (2013.01); *C25D 11/00* (2013.01); *H01G 9/2031* (2013.01); *H01L 31/1884* (2013.01); *H01L 51/445* (2013.01); *Y02E 10/542* (2013.01); *Y02E 10/549* (2013.01)

(58) Field of Classification Search
CPC ............ C25D 11/00; C25D 9/08; C25D 3/30; H01L 31/022466; H01L 31/1884; H01L 51/442; H01L 51/445; H01G 9/2031; H01B 1/08
USPC .............................................. 205/80–90, 405
See application file for complete search history.

(56) References Cited

U.S. PATENT DOCUMENTS

| | | | | |
|---|---|---|---|---|
| 2,407,579 | A | * | 9/1946 | Schweikher ................... 205/302 |
| 3,607,352 | A | * | 9/1971 | Fadgen et al. ................. 427/306 |
| 4,387,116 | A | | 6/1983 | Bucker |
| 4,726,965 | A | * | 2/1988 | Zondler ....................... 427/97.3 |
| 5,447,889 | A | * | 9/1995 | Sano ............................. 438/795 |
| 5,474,621 | A | | 12/1995 | Barnard |
| 6,306,544 | B1 | | 10/2001 | Frysz et al. |
| 6,541,158 | B2 | | 4/2003 | Frysz et al. |
| 6,555,741 | B1 | | 4/2003 | Hopkins et al. |
| 6,670,213 | B2 | * | 12/2003 | Halls et al. ...................... 438/52 |
| 2004/0262154 | A1 | | 12/2004 | Gibson et al. |
| 2005/0034755 | A1 | * | 2/2005 | Okada et al. ................... 136/256 |
| 2005/0072458 | A1 | | 4/2005 | Goldstein |
| 2007/0119498 | A1 | | 5/2007 | Park et al. |
| 2007/0273276 | A1 | | 11/2007 | Ottermann et al. |

FOREIGN PATENT DOCUMENTS

| | | |
|---|---|---|
| JP | 60-245782 | 12/1985 |
| JP | 62-94887 | 5/1987 |
| JP | 07-065650 | 3/1995 |
| JP | 08-120448 | 5/1996 |
| JP | 2005-332782 | 12/2005 |
| WO | WO 03/061018 A1 | 7/2003 |
| WO | WO 03/081609 A1 | 10/2003 |
| WO | 2005103340 A1 | 11/2005 |
| WO | 2007015249 A2 | 2/2007 |
| WO | 2007015250 A2 | 2/2007 |

OTHER PUBLICATIONS

B.J. Baliga, S.K. Ghandhi, "Electrochemical Patterning of Tin Oxide Films", J. Electrochem. Soc., vol. 124, 1977. p. 1059-1060.*
M. Brumbach, P.A. Venemen, F.S. Marrikar, T. Schulmeyer, A. Simmonds, W. Xia, P. Lee, and N. R. Armstrong, "Surface Composition and Electrical and Electrochemical Properties of Freshly Deposited and Acid_Etched Indium Tin Oxide Electrodes" Langmuir, vol. 23, 2007, p. 11089-11099.*
M. Navarro, J. M. Lopez-Villegas, J. Samitier, J.R. Morante, J. Bausells, A.Merlos, "Electrochemical etching of porous silicon sacrificial layers for micromachining applications", J. Micromech. Microeng. 7 (1997) p. 131-132.*

(Continued)

*Primary Examiner* — Jennifer K. Michener
*Assistant Examiner* — Marla D McConnell
(74) *Attorney, Agent, or Firm* — Pearl Cohen Zedek Latzer Baratz LLP

(57) ABSTRACT

The invention relates to nickel-cobalt alloys as current collectors and conductive interconnects, and to methods of deposition thereof on transparent conductive oxides. The invention further relates to transparent conductive oxides on which a nickel-cobalt alloy is deposited and to electrodes made of such transparent conductive oxides for photochemical applications, in particular, for dye-sensitized solar cells (DSSCs).

11 Claims, No Drawings

(56) References Cited

OTHER PUBLICATIONS

Y. Matsuo, K. Hashimoto, Y. Sugie, T. Nakamura, J. Tsunoda, "Micromachining of Tin Oxide Film by Electrochemical Reduction Process" J. Electrochem. Soc., vol. 145, 1998. p. 3067-3069.*

Huang, et al "The electrochemical behavior of tin-doped indium oxide during reduction in 0.3 M hydrochloric acid" Electrochimica Acta, 2003, 3599-3605.*

Tulloch, G.E., "Light and Energy-Dye Solar Cells for the 21st Century," Journal of Photochemistry and Photobiology A: Chemistry, 2004, pp. 209-219.

Gratzel, M., "Dye-Sensitized Solar Cells," Journal of Photochemistry and Photobiology C: Photochemistry Reviews 4, 2003, pp. 145-153.

Dai et al., Dye-sensitized solar cells, from cell to module, Solar Energy materials & Solar Cells, 84:125-133 (2004).

Lee et al., Grid type dye-sensitized solar cell module with carbon counter electrode, Journal of Photochemistry and Photobiology A: Chemistry, 194:27-30 (2008).

Lee et al., Carrier collectors for dye sensitized solar cells, Proc. of SPIE, 6038:60381Ua-1 (2006).

Rousar et al., Optimization of parameters of an electrochemical photovoltaic regenerative solar cell, Solar Energy materials and Solar cells, 43:249-262 (1996).

Grätzel, M.,"The Advent of Mesoscopic Injection Solar Cells" Prog. Photovolt: Res. Appl., 2006, 14, 429-442.

Späth, M. Sommeling, P.M. van Roosmalen, J.A.M. Smit, H.J.P. van der Burg, N.P.G. Mahieu, D.R. Bakker, N.J. Kroon, J.M.,"Reproducible Manufacturing of Dye-Sensitized Solar Cells on a Semi-automated Baseline" Prog. Photovolt: Res. Appl., 2003, 11, 207-220.

Kay, A. Grätzel, M.,"Low cost photovoltaic modules based on dye sensitized nanocrystalline titanium dioxide and carbon powder" Sol. Energy Mater. Sol. Cells, 1996, 44, 99-117.

Grätzel, M.,"Perspectives for Dye-sensitized Nanocrystalline Solar Cell" Prog. Photovolt: Res. Appl., 2000, 8, 171-185.

Arakawa, H. et al., Book of abstracts of 16th international conference on photochemical conversion and storage of solar energy, Uppsala, Sweden, Jul. 2-7, 2006, W4-P-10.

Goto, K. Kawashima, T. Tanabe, N., "Heat-resisting TCO films for PV cells" Sol Energy Mater Sol Cells, 2006, 90, 3251-3260.

Dai, S. Wang, K. Weng, J. Sui, Y. Huang, Y. Xiao, S. Chen, S. Hu, L. Kong, F. Pan, X. Shi, C. Guo, L., "Design of DSC panel with efficiency more than 6%" Sol. Energy Mater. Sol. Cells, 2005, 85, 447-455.

Office Action for Japanese Patent App. No. 2009-535187, mailed on Feb. 8, 2013.

D. M. Tench et al. "Reduction of metallic surface oxides via an electrochemically-generated redox species" Journal of Applied Electrochemistry 25 (1995) 947-952, Jun. 28, 1994.

M. Senthilkumar et al. "Electrochemical instability of indium tin oxide (ITO) glass in acidic pH range during cathodic polarization" Materials Chemistry and Physics 108 (2008) 403-407, Apr. 11, 2007.

Li et al, "Improved performance of PLEDs with ITO surface treatments", Thin Film Solids, 2005, pp. 57-82.

Office Action of U.S. Appl. No. 13/432,368 dated Oct. 6, 2014.

Japanese Office Action of Japanese Application No. 2013-162419 dated Sep. 24, 2014.

* cited by examiner

NICKEL-COBALT ALLOYS AS CURRENT COLLECTORS AND CONDUCTIVE INTERCONNECTS AND DEPOSITION THEREOF ON TRANSPARENT CONDUCTIVE OXIDES

FIELD OF THE INVENTION

The present invention relates to nickel-cobalt alloys as current collectors and conductive interconnects, and to methods of deposition thereof on transparent conductive oxides. The invention further relates to transparent conductive oxides on which a nickel-cobalt alloy is deposited and to electrodes made of such transparent conductive oxides for photochemical applications, in particular, for dye-sensitized solar cells (DSSCs).

BACKGROUND OF THE INVENTION

Solar energy has the potential to supply the main part of energy demand of future generations. Most photovoltaic solar cells currently produced are based on silicon p-n junctions. However, there is an increasing interest in dye-sensitized solar cells (DSSCs) due to the simple materials and equipment required for their manufacturing, their potentially low-cost production and the adequate and stable conversion efficiencies currently achieved in small-area cells (11.3% in a DSSC smaller than 1 cm$^2$). The development of industrial DSSCs as one of the most promising devices for solar energy conversion is advancing rapidly (Grätzel, 2006).

DSSCs consist of a nanocrystalline, mesoporous network of a wide bandgap semiconductor (the best found was TiO$_2$), covered with a monolayer of dye molecules. The semiconductor is deposited onto a transparent conductive oxide (TCO) electrode, through which the cell is illuminated. The TiO$_2$ pores are filled with a redox mediator, which acts as a conductor, connected to a counter electrode. Upon illumination, electrons are injected from the photo-excited dye into the semiconductor and move towards the transparent conductive substrate, while the electrolyte reduces the oxidized dye and transports the positive charges to the counter electrode.

As stated hereinabove, small-area DSSCs have achieved a conversion efficiency of 11.3% by the Ecole Polytechnique Federale de Lausanne (EPFL) group, but the efficiency of DSSC modules larger than 100 cm$^2$ is still less than 7% (Grätzel, 2006). Scaling up the total device area leads to problems related to efficient current collection (Späth et al., 2003; Dai et al., 2005). The relatively high sheet resistance of both fluorine doped tin oxide (FTO) and indium oxide doped by tin (ITO) layers used as current collectors limits the maximal distance from a photoactive point to a current collector to about 1 cm (Kay and Grätzel, 1996). The practical efficiency of a DSSC strictly depends on the series resistance of the cell that lowers the fill factor. This influence becomes more pronounced in cells with larger area. In order to minimize internal resistive losses in a DSSC module with an area of several cm$^2$ or larger, interconnects must be applied in series connections or as current collectors. At present, a design with a current collector grid applied to the conducting glass or plastic is prevailing in DSSC modules with an area of 100 cm$^2$ and larger.

Metals tested for the grid to reduce resistive losses of transparent conductive oxides on glass and plastic included Ag, Au, Cu, Al, Ni, but all of these metals were corroded by the iodine electrolyte (Tulloch et al., 2004). The only elements that were found stable to corrosion are Pt, Ti, W and carbon (Tulloch et al., 2004; U.S. Pat. No. 6,555,741); however, Pt is too expensive and Ti, W and carbon are too resistive (Tulloch et al., 2004). At present, the material of choice is silver (Späth et al., 2003; Grätzel, 2000; Arakawa et al., 2006; Dai et al., 2005). However, Ag undergoes rapid corrosion in the presence of iodine-containing redox electrolyte and has to be protected by using high quality polymer- or glass-based protecting layers without pinholes. The protecting layer increases the height of the grid and the distance between the electrodes of DSSC that leads to decreased fill factor and cell efficiency. The main method for producing the current collecting silver grid is screen printing.

An additional approach is to use highly conducting substrates, namely, metallic foils (Tulloch et al., 2004) or double-layered TCO consisting of an inner layer of ITO and an outer layer of FTO (Goto et al., 2006). However, metallic foils are not transparent, and illumination from a back side of the cell leads to a decreasing photovoltaic efficiency. On the other hand, double-layered TCO is too expensive.

Upscaling the technology from small DSSCs to large-area modules leads to loss of an active area. At present, the largest disclosed active area for DSSCs modules with a size of 100 cm$^2$ is about 68% (Arakawa et al., 2006). The noneffective area increases the cost of the DSSC. Increasing the active area is one of the goals for DSSC commercialization.

SUMMARY OF THE INVENTION

It has been found, in accordance with the present invention, that nickel-cobalt alloys are highly resistant to corrosion, thus, to iodine-containing redox electrolytes; highly stable at the sintering temperatures for glass-based photoelectrochemical devices (450-550° C.); and have a low recombination rate with electrons in nanoporous semiconductors at operational conditions, a good electrical conductivity and a satisfactory plasticity. These alloys are, thus, suitable as current collectors and conductive interconnects for use in photoelectrochemical applications and, in particular, in dye-sensitized solar cells (DSSCs).

In one aspect, the present invention thus relates to a current collector for use in photochemical applications, comprising a nickel-cobalt alloy.

In another aspect, the present invention relates to a conductive interconnect for use in photochemical applications, comprising a nickel-cobalt alloy.

In a further aspect, the present invention relates to a transparent conductive oxide (TCO) on which a nickel-cobalt alloy is deposited. In a preferred embodiment, the TCO on which a nickel-cobalt alloy is deposited is an electrode for a photochemical application, preferably a dye-sensitized solar cell (DSSC).

In still a further aspect, the present invention provides a method for electrochemical or chemical deposition of a metal or an alloy on a transparent conductive oxide (TCO) surface with good adhesion of the deposited metal or alloy on the TCO surface, comprising: (a) reduction of the upper layer of the TCO surface; (b) sensitization of the reduced TCO surface, for the improvement of the adhesion of metallic ions to this surface; and (c) electrochemical or electroless deposition of said metal or alloy on the TCO surface.

DETAILED DESCRIPTION OF THE INVENTION

The composition of the nickel-cobalt alloy used in the various aspects of the present invention may be, without limiting, in the range of nickel 0.1-99.9%, cobalt 99.9-0.1%, preferably nickel 1-99%, cobalt 99-1%, more preferably nickel 2-98%, cobalt 98-2%. In one embodiment, the composition is 41.5% Co, 58.5% Ni. In another embodiment, the composition is 25.8% Co, 74.2% Ni.

The current collector and the conductive interconnect comprising said nickel-cobalt alloy may be further protected by a non-conductive material. Said non-conductive material may be, without being limited to, an inorganic and/or organic coating, a polymeric material such as inorganic-organic polymeric coatings produced as disclosed in International Publication No. WO 2007/015249 of the same applicant, herewith incorporated by reference in its entirety as if fully described herein, a hot-melt seal foil, e.g. the resins Surlyn or Bynel (DuPont), with a protective polypropylene cover foil, a low temperature melting glass frit, or a ceramic glaze.

The nickel-cobalt alloys described above may further be deposited on a TCO for use in various applications. Such TCOs constitute another aspect of the present invention and may be any suitable transparent conductive oxide. In preferred embodiments, the TCO is fluorine-doped tin oxide (FTO) or indium oxide doped by tin (ITO).

The invention further provides electrodes made of the TCO on which a nickel-cobalt alloy is deposited for photochemical applications. Said photochemical application may be any application in which illumination is performed through an electrode made of a transparent conductive oxide. Examples of such photochemical applications are dye-sensitized solar cells (DSSCs), water purification or photocatalysis. In a most preferred embodiment, the photochemical application is a DSSC.

Thus, the present invention further relates to a dye-sensitized solar cell (DSSC) comprising a transparent conductive oxide (TCO) electrode on which a current collector is deposited, wherein said current collector comprises a nickel-cobalt alloy.

As previously described, the solar energy conversion efficiency of a DSSC strictly depends on the series resistance of the cell that lowers the fill factor. Since scaling up the total DSSC area leads to problems related to efficient current collection, this influence becomes more pronounced in DSSCs with larger area, namely, in DSSC modules larger than 100 $cm^2$. In order to minimize internal resistive losses in a DSSC module with an area of several $cm^2$ or larger, interconnects must be applied in series connections or as current collectors.

Thus, in one preferred embodiment, the present invention relates to an array comprising at least two dye-sensitized solar cells (DSSCs) as described hereinabove, wherein each two of said at least two DSSCs are connected by a conductive interconnect and said conductive interconnect comprises a nickel-cobalt alloy.

The nickel-cobalt alloys can be deposited on TCOs by different methods such as electrochemical or chemical methods, screen printing and laying wires from said alloy into grooves in TCO. The criteria for the deposition method selection are high quality, low cost, simplicity and continuous production process. The electrochemical deposition is a widely used, simple and relatively low cost process. In addition, underlayers and overlayers of other conductive materials such as metals can be applied. Wires (or lines) that are electrochemically deposited in optimal conditions are noted for smooth surface, which can easily be protected with an additional overlayer (or overlayers) of conductive or non-conductive material, compared with screen-printed lines, having large internal surface area of huge amount of small particles.

While reducing the present invention to practice, the present inventors have found a simple method for electrochemical or chemical deposition of metals and alloys on a TCO with a very good adhesion of the deposited metal or alloy on the TCO surface. According to this method, the upper layer of the TCO surface is first reduced, and the reduced TCO surface is then sensitized, in order to improve the adhesion of metal or alloy thereto, prior to the step of deposition of the metal or alloy.

In particular, the method of the present invention comprises the steps of: (a) reduction of the upper layer of the TCO surface; (b) sensitization of the reduced TCO surface, for the improvement of the adhesion of metallic ions to this surface; and (c) electrochemical or electroless deposition of a metal or alloy on the TCO surface.

The TCO on which metals or alloys can be deposited according to the method of the present invention may be any suitable TCO such as, without being limited to, fluorine-doped tin oxide (FTO) and indium oxide doped by tin (ITO).

The metals and alloys which can be deposited on the TCO according to this method include, without limitation, Ni, Cu, Co, Fe, Pd, Pt, Sn, nickel-cobalt alloy, nickel-iron alloy, nickel-chromium-iron alloy, nickel-palladium alloy, nickel-tungsten alloy, nickel-tin alloy, nickel-molybdenum alloy, nickel-cobalt-rhenium alloy, nickel-ruthenium alloy or cobalt-tungsten alloy. In preferred embodiments, said metal or alloy is a nickel-cobalt alloy, most preferably a nickel-cobalt alloy as defined above.

In one embodiment, the reduction of the TCO surface in step (a) and the sensitization of the reduced TCO surface in step (b) are combined into one step.

The reduction of the TCO surface, according to the method of the present invention, may be carried out by reducing plasma, an electrochemical process or a chemical process. In a preferred embodiment, said reduction of the TCO surface is carried out by an electrochemical reduction.

According to features of the present invention, the electrochemical reduction may be carried out in an electrochemical cell, in which the TCO is connected to the cathodic polarity; the anode is made of an inert insoluble conductive material; and the electrolyte is pure water or a diluted solution of at least one halide salt in water and/or in a polar organic solvent. Said halide salt may be, without limiting, $NH_4Cl$, $SnCl_2$, $NH_4F$, $NH_4Br$ or combinations thereof. During the operation of said electrochemical cell, a halogen emission could take place at the anode.

The anode being used in the electrochemical cell, according to the present invention, may be made of, without being limited to, graphite, platinum, TCO or titanium coated with platinum.

In cases the electrolyte being used in said electrochemical cell is a diluted solution of an halide salt in a polar organic solvent, said solvent may be, without limiting, any straight or branched $C_1$-$C_6$ alkanol such as methanol, ethanol, propanol, isopropanol, butanol, isobutanol, sec-butanol, tert-butanol, pentanol, neopentanol, sec-pentanol, hexanol or a mixture thereof, preferably ethanol.

According to features of the present invention, the halide salt electrolyte used in said electrochemical cell may be dissolved in water supplemented with a polar organic solvent, as defined above, or it may be dissolved in a polar organic solvent supplemented with water.

In one embodiment, the electrolyte is pure water, and a high voltage is employed.

The sensitization of the reduced TCO surface, according to the method of the present invention, may be carried out in a solution of tin (II) or titanium (III) salts, e.g. $SnCl_2$, in water or in a polar organic solvent as defined above, preferably ethanol. During this process, tin (II) or titanium (III) ions adsorb on the surface of the treated TCO and hydrolyze during a following washing with water. The hydrolysis products adsorb on the TCO surface which becomes hydrophilic, and the adhesion of the metallic ions deposited during the following step of deposition is improved. The sensitization step further depends on the nature of the TCO treated. In cases of a highly chemically stable TCO such as, for example, fluorine-doped tin oxide (FTO), sensitization may be combined with etching of the reduced metal. For a less chemically stable TCO, such as, for example, indium oxide doped by tin (ITO), sensitization may be carried out without etching of the reduced metal. The sensitization step may also be combined with the reduction step (a) into one step. The need of etching the reduced metal depends also on the adhesion of the reduced metal, namely, Sn in the case of FTO, or both Sn and In in the case of ITO, to the TCO surface. If the adhesion is good, the etching can be eliminated, and if the adhesion is poor, the reduced metal should be etched.

The etching process is a chemical process carried out in an acid or base solution, or in a solution of an oxidating agent together with a complexing agent. Suitable acids for this purpose may be, without limitation, hydrochloric acid or sulfuric acid; and suitable bases may be, without limitation, sodium hydroxide or potassium hydroxide. Suitable oxidating agents may be, without being limited to, iodine, chlorine or bromine, and suitable complexing agents may be, without being limited to, ammonium iodide, ammonium chloride, ammonium bromide, ammonium citrate, ammonium oxalate, potassium-sodium tartrate and Trilon B (ethylenediaminetetraacetic acid disodium salt).

In one embodiment, as described hereinabove, etching of the reduced metal is carried out simultaneously with sensitization of the TCO surface in an acid or base solution of tin (II) or titanium (III) salts in water or in a polar organic solvent. In this case, tin (II) halide salts can be used, possibly with other halide salts.

In another embodiment, the etching of the reduced metal is carried out as described above separately from the sensitization step, after the reduction step (a) but prior to the sensitization step (b).

Although the sensitization of the reduced TCO surface, according to the method of the present invention, is required in order to improve the adhesion of the metal or alloy thereto, in certain cases, where only a thin layer, e.g., less than 1 μm, of the metal or alloy, is sufficient, the sensitization step may be omitted.

Thus, in still another aspect, the present invention provides a method for electrochemical or chemical deposition of a metal or an alloy on a transparent conductive oxide (TCO) surface with good adhesion of the deposited metal or alloy on the TCO surface, comprising: (a) reduction of the upper layer of the TCO surface; and (b) electrochemical or electroless deposition of said metal or alloy on the reduced TCO surface.

The invention will now be illustrated by the following non-limiting Examples.

EXAMPLES

Example 1

Electrochemical Fabrication of Nickel-Cobalt Wires on FTO Glass and DSSC Prepared Therefrom FTO glass with a size of 70 mm×40 mm (8 Ohm/square, Hartford Glass Co. Inc., USA) was thoroughly cleaned with trichloroethylene, mild soap and ethanol, washed with water and distilled water, and dried in a filtered air stream. The FTO glass was then covered with a mask prepared from a chemical resistant paint (Enplate Stop-Off No 1, Enthone-OMI, Inc., which is represented in Israel by Amza Surface Finishing Technologies), leaving uncovered areas for 4 wires, each area having dimensions of 55 mm×0.8 mm, with a space of 7.7 mm between, and an area for a collector stripe at one short side of the substrate with a length of 30 mm and a width of 3 mm at a distance of 5 mm from the edge of the substrate.

After drying the mask at room temperature for about 1 h, hydrophilization of the mask was performed for a better wetting of the mask boundaries with the FTO glass. This step is desirable in cases hydrophobic masking materials are used, preventing the accumulation of hydrogen bubbles on the boundaries of the mask and the TCO, which interfere with the following electrochemical reduction of the upper layer of said TCO. The hydrophilization of the mask was performed in a solution similar to the "sensitization solution" (see hereinbelow): 2.5 g $SnCl_2*2H_2O$ and 20 ml HCl (1.19 $g/cm^3$) in 250 ml distilled water, at room temperature without stirring for 10 min. After washing with water and distilled water, the uncovered areas of the FTO were further cleaned in a solution similar to the "reduction solution" (see hereinbelow): 0.25 g $NH_4Cl$ in 250 ml distilled water, under stirring with magnetic stirrer at room temperature, at the anodic polarity with an inert cathode (Pt cathode was used), with constant current density of 20 $mA/cm^2$ and during 1 min. This cleaning procedure can be different for different masking materials, depending on the properties of the masking material used.

Then, the reduction of the upper layer of the FTO glass was performed by treating the FTO glass with a solution of 0.25 g $NH_4Cl$ in 250 ml distilled water (herein "reduction solution"), under stirring with magnetic stirrer at room temperature, at the cathode polarity with an inert anode (Pt anode was used). The constant current density was 10 $mA/cm^2$ and the duration was 50 sec. The color of the uncovered areas of the FTO glass changed from colorless to light brown due to the tin reduction.

After washing with distilled water, the substrate was chemically treated with a solution of 2.5 g $SnCl_2*2H_2O$ and 20 ml of HCl (1.19 $g/cm^3$) in 250 ml distilled water (herein "sensitization solution"), at room temperature without stirring for 10 min. The color of the FTO glass changed again to colorless due to the reduced tin etching. In addition, during said treatment, tin (II) ions adsorb onto the surface and hydrolyze during following washing with water and distilled water. The hydrolysis products adsorb onto the etched FTO glass surface, which then becomes hydrophilic and, as a result, the adhesion of the metallic ions to the surface in the next step of electrochemical or electroless deposition is improved.

For electrochemical deposition of a nickel-cobalt alloy, an electrolyte containing $NiSO_4*6H_2O$ 60 g/l, $CoSO_4*7H_2O$ 15 g/l, $H_3BO_3$ 25 g/l and NaCl 10 g/l, with pH=5.6, was prepared. The deposition was carried out at room temperature, under constant current density of 5 $mA/cm^2$ for 60 min with a nickel anode. After washing and drying the substrate, the mask was removed. The chemical composition of the alloy was 41.5% Co and 58.5% Ni, and the height of the wires above the FTO glass surface was 7.5 μm.

The passivation of the alloy was carried out in a solution of $K_2Cr_2O_7$ 60 g/l at room temperature for 10 min. After washing and drying the substrate, a new mask from the chemical resistant paint mentioned hereinabove was prepared, leaving uncovered areas for the same as above 4 wires, each area having dimensions of 55 mm×1.5 mm, with a space of 7 mm between, and an area for the collector stripe.

After drying the mask at room temperature for about 1 h, a thin dielectric $Al_2O_3$-coating was deposited as disclosed in International Publication No. WO 2007/015249. In particular, 20 mg of iodine, 4 ml of acetone and 5 μl of nitric acid were added to 250 ml of ethanol, and the mixture was stirred with magnetic stirrer for 24 h in a closed vessel. Using an inert atmosphere glove box, 0.5 ml of Al(OsecC$_4$H$_9$)$_3$ were placed in a bottle and hermetically sealed. The sealed bottle was transferred outside the glove box where, under ambient conditions, the aforesaid ethanolic solution was added to the Al(OsecC$_4$H$_9$)$_3$, inside the bottle, under vigorous stirring. The solution was sonicated in an ultrasound bath and then stirred, during 24 h. Subsequently, 2 ml of deionized water were added, and the solution was stirred for additional 24 h, resulting in ~250 ml transparent sol (the color of the sol gradually changed from yellow to colorless). The sol was left for aging in a closed vessel without stirring at ambient conditions for 7 days, after which it was ready for electrophoretic deposition (EPD). The electrophoretic cell contained two electrodes placed vertically at a distance of 40 mm in the aforesaid transparent sol. The FTO substrate with wires served as the cathode and a F-doped-SnO$_2$ conductive glass served as a counter-electrode. The FTO substrate with the wires was electrically connected via the collector stripe. The alumina coating was deposited only onto the wires area. The EPD process was performed at room temperature under constant current, using a Keithley 2400 Source Meter as a power supply. The current density was 0.2 mA/cm$^2$ and the sol-gel EPD duration was 3 min. After drying the FTO substrate at ambient conditions, the masking paint was mechanically removed and the substrate was washed with ethanol and dried, first at ambient conditions and then by thermotreatment, during which temperature was slowly increased (4° C./min) up to 500° C., and following an additional 30 min at 500° C., it was slowly decreased to room temperature (as the oven was cooled). A glassy, dense alumina coating with the thickness of about 1 μm, completely covering the mettalic wires, was obtained.

In the next step, a DSSC was fabricated from the FTO substrate with the electrochemically deposited wires. For that purpose, nanocrystalline TiO$_2$ layer was deposited on the aforesaid substrate by EPD, followed by mechanical pressing, as disclosed in International Publication No. WO 2007/015250 of the same applicant, herewith incorporated by reference in its entirety as if fully described herein. In particular, 1 g of commercially available titania nanopowder P-90 (Degussa AG, Germany) was mixed with 150 ml ethanol and 0.6 ml acetylacetone, and stirred with magnetic stirrer for 24 h in a closed vessel (herein "P-90 suspension"). 30 mg iodine, 6 ml acetone and 3 ml deionized water were added to 100 ml ethanol and stirred with magnetic stirrer or sonicated with cooling of the solution in an ice bath till iodine was dissolved (herein "charging solution"). After that, the P-90 suspension was added to the charging solution and mixed, followed by sonication during 15 min using an Ultrasonic Processor VCX-750 (Sonics and Materials, Inc.) to homogenize the mixture with cooling of the suspension in an ice bath. About 250 ml suspension was obtained and applied for EPD.

The electrophoretic cell contained the FTO substrate with the electrochemically deposited wires as the cathode and another piece of untreated FTO glass (8 Ohm/square) as the anode. The FTO substrate with the wires was electrically connected via the collector stripe. The two electrodes were placed vertically at a distance of 40 mm and immersed in the aforesaid suspension. The EPD process was performed at room temperature using constant current mode. A Keithley 2400 Source Meter was applied as a power supply. The current density was 0.45 mA/cm$^2$ and the deposition time was 3 min and 20 sec. At that point, after every 40 sec of deposition, the cathode was removed from the suspension and dried first at room temperature and then in an oven at a temperature of 70-120° C. for 1-3 min; cooled till room temperature; and placed again in the suspension for continued EPD. A homogeneous adherent TiO$_2$ nanoporous layer with thickness of 24-25 μm was obtained.

After drying at 150° C. during 40 min and cooling to room temperature, the fabricated electrode was placed on a plate of hydraulic programmable press. Hexane was uniformly dropped on the surface of the TiO$_2$ film, and the wet layer was immediately covered with polyethylene foil (20 μm). A pressure of 700 kg/cm$^2$ was applied, resulting in a homogeneously pressed TiO$_2$ film without visible defects. The thickness of the pressed titania film was 14 μm.

After sintering at 550° C. during 90 min, the fabricated electrode was applied as a photoelectrode in a DSSC. The nanoporous TiO$_2$ layer was sensitized with N3-dye [cis-di (isothiocyanato)-bis(4,4-dicarboxy-2,2-bipyridine)ruthenium(II)] (Dyesol, Australia) by immersing the still warm (80-100° C.) film in said dye solution (0.5 mM in ethanol) and keeping it during 72 h at room temperature. The dye-covered electrode was then rinsed with ethanol and dried under a filtered air stream. The current collector stripe was cleaned from an oxide layer by scratching. A two-electrode sandwich cell with an effective area of 9 cm$^2$ was employed to measure the performance of a DSSC using a Pt-coated FTO layered glass as a counter-electrode. The composition of the electrolyte was: 0.6 M dimethylpropylimidazolium iodide, 0.1 M LiI, 0.05 M I$_2$, 0.5 M 1-methylbenzimidazole in 1:1 (v/v) acetonitrile-methoxypropionitrile. Photocurrent-voltage characteristics were performed at the real sun. The illumination was 73 mW/cm$^2$. The measurement showed: short-circuit photocurrent (J$_{sc}$) of 11.5 mA/cm$^2$, open-circuit photovoltage (V$_{oc}$) 715 mV, fill factor (FF) 59.1% and light-to-electricity conversion efficiency of 6.6%. The calculation was done based on the total illuminated area, but the active area was only 85% from the total illuminated area. The light-to-electricity conversion efficiency calculated for the active area was 7.76%.

Measuring the photovoltaic performance of a DSSC prepared in the same way, but without wires, with the same illumination area of 9 cm$^2$ showed: short-circuit photocurrent (J$_{sc}$) of 10 mA/cm$^2$, open-circuit photovoltage (V$_{oc}$) 776 mV, fill factor (FF) 28.6% and light-to-electricity conversion efficiency of only 3%. These results show that the wires fabrication led to substantial improvement of both the fill factor and the photovoltaic efficiency.

Example 2

Electrochemical Fabrication of Nickel-Cobalt Wires on ITO/PET Conductive Plastic and DSSC Prepared Therefrom Conductive plastic indium-tin oxide (ITO) coated polyester (PET), ITO/PET, with a size of 62.5 mm×40 mm (55 Ohm/square, Bekaert Specialty Films, USA) was thoroughly cleaned with ethanol, washed with water and distilled water, and dried in a filtered air stream. The ITO/PET was then covered with a mask prepared from a chemical resistant paint (Enplate Stop-Off No 1, Enthone-OMI, Inc., which is represented in Israel by Amza Surface Finishing Technologies), leaving uncovered areas for 4 wires, each area having dimensions of 40 mm×1.5 mm, with a space of 7 mm between, and an area for a collector stripe at one short side of the substrate with a length of 30 mm and a width of 3 mm at a distance of 5 mm from the edge of the substrate.

After drying of the mask at room temperature for about 1 h, electrochemical reduction of the upper layer of the ITO/PET was performed by treating the ITO/PET with a solution of 0.25 g $SnCl_2*2H_2O$ and 10 ml distilled water in 240 ml ethanol, under stirring with magnetic stirrer at room temperature, at the cathode polarity with an inert anode (Pt anode was used). The constant current density was 2.5 $mA/cm^2$ and the duration was 20 sec. The color of the uncovered area of the ITO/PET changed from colorless to light brown due to the indium and/or tin reduction. During this treatment, tin (II) ions adsorb onto the surface and hydrolyze during following washing with distilled water. The hydrolysis products adsorb onto the reduced ITO/PET surface, which then becomes hydrophilic and, as a result, the adhesion of the metallic ions to the surface in the next step of the electrochemical or electroless deposition is improved.

For electrochemical deposition of a nickel-cobalt alloy, an electrolyte containing $NiSO_4*6H_2O$ 30 g/l, $CoSO_4*7H_2O$ 6 g/l, $(NH_4)_2SO_4$ 10 g/l and $MgSO_4*7H_2O$ 10 g/l, with pH=6 was prepared. The deposition was carried out at room temperature, under constant current density of 5 $mA/cm^2$ for 20 min with a nickel anode. The chemical composition of the alloy was 25.8% Co and 74.2% Ni, and the height of the wires above the ITO/PET surface was 1.6 μm.

After washing and drying the substrate, the passivation of the alloy was carried out in a solution of $K_2Cr_2O_7$ 20 g/l at room temperature for 10 min. Then, a thin dielectric $Al_2O_3$-coating was deposited as described in Example 1 hereinabove; however, the deposition duration was 2 min instead of 3 min. After drying the ITO/PET substrate at ambient conditions, the masking paint was mechanically removed and the ITO/PET substrate was washed with ethanol and dried, first at ambient conditions and then at 120° C. for 30 min.

In the next step, a DSSC was fabricated from the ITO/PET substrate with the electrochemically deposited wires. For that purpose, nanocrystalline $TiO_2$ layer was deposited on the aforesaid substrate by electrophoretic deposition (EPD), followed by mechanical pressing, as described in Example 1 hereinabove. In particular, 0.65 g of commercially available titania nanopowder P-25 (Degussa AG, Germany) was mixed with 150 ml ethanol and 0.4 ml acetylacetone, and stirred with magnetic stirrer for 24 h in a closed vessel (herein "P-25 suspension"). 27 mg iodine, 4 ml acetone and 2 ml deionized water were added to 100 ml ethanol and stirred with magnetic stirrer or sonicated with cooling of the solution in an ice bath till iodine was dissolved (herein "charging solution"). After that, the P-25 suspension was added to the charging solution and mixed, followed by sonication during 15 min using an Ultrasonic Processor VCX-750 (Sonics and Materials, Inc.) to homogenize the mixture with cooling of the suspension in an ice bath. About 250 ml suspension was obtained and applied for EPD.

The electrophoretic cell contained the ITO/PET substrate with the electrochemically deposited wires as the cathode and FTO conductive glass (8 Ohm/square) as the counter-electrode. The ITO/PET substrate with the wires was electrically connected via the collector stripe. The two electrodes were placed vertically at a distance of 30 mm and immersed in the aforesaid suspension. The EPD process was performed at room temperature using constant current mode. A Keithley 2400 Source Meter was applied as a power supply. The current density was 0.33 $mA/cm^2$ and the deposition time was 2 min. A homogeneous adherent $TiO_2$ nanoporous layer with thickness of 12-14 μm was obtained.

After drying at 90° C. during 40 min and cooling to room temperature, the fabricated electrode was placed on a plate of hydraulic programmable press. Hexane was uniformly dropped on the surface of the $TiO_2$ film, and the wet layer was immediately covered with polyethylene foil (20 μm). A pressure of 800 $kg/cm^2$ was applied, resulting in a homogeneously pressed $TiO_2$ film without visible defects. The thickness of the pressed titania film was 7-7.5 μm.

In order to further improve the photovoltaic performance of the DSSC fabricated from this electrode, a titania polymeric coating was deposited by a sol-gel EPD process, as described in Example 1 hereinabove (for alumina coating). For that purpose, 15 mg iodine, 4 ml acetone and 2 ml deionized water were added to 250 ml ethanol, and the mixture was stirred with magnetic stirrer for 24 h in a closed vessel. Using an inert atmosphere glove box, 0.2 ml of $Ti(OiC_3H_7)_4$ was placed in a bottle and hermetically sealed. The sealed bottle was transferred outside the glovebox, where under ambient conditions the above-mentioned solution was added to the precursor, inside the bottle, under vigorous stirring. The solution was stirred during 24 h resulting in ~250 ml transparent sol (the color of the sol gradually changed from yellow to colorless). The sol was left for aging in a closed vessel without stirring at ambient conditions for 7 days, after which it was ready for EPD. The resulting transparent sol was applied for sol-gel EPD coating of titania nanoporous electrode on the ITO/PET with the wires. The electrophoretic cell contained two electrodes placed vertically at a distance of 40 mm in the aforesaid transparent sol. The titania nanoporous electrode on the ITO/PET with the wires served as the cathode and a FTO conductive glass served as a counter-electrode. The EPD process was performed at room temperature under constant current, using a Keithley 2400 Source Meter as a power supply. The current density was 80 $\mu A/cm^2$ and the EPD duration was 2 min. After drying the coated electrode, first at ambient conditions and then in an oven at 150° C. for 40 min, the fabricated electrode was applied as photoelectrode in a DSSC.

The photovoltaic measurement was carried out as described in Example 1 hereinabove. The nanoporous $TiO_2$ layer was sensitized with N3-dye (Dyesol, Australia) by immersing the still warm (80-100° C.) film in said dye solution (0.5 mM in ethanol) and keeping it during 72 h at room temperature. The dye-covered electrode was then rinsed with ethanol and dried under a filtered air stream.

A two-electrode sandwich cell with an effective area of 9 $cm^2$ was employed to measure the performance of a DSSC using a Pt-coated FTO layered glass as a counter-electrode. The composition of the electrolyte was: 0.6 M dimethylpropylimidazolium iodide, 0.1 M LiI, 0.05 M $I_2$, 0.5 M 1-methylbenzimidazole in 1:1 (v/v) acetonitrile-methoxypropionitrile. Photocurrent-voltage characteristics were performed at the real sun. The illumination was 80 $mW/cm^2$. The illumination area was 9 $cm^2$. The measurement showed: short-circuit photocurrent ($J_{sc}$) of 4.5 $mA/cm^2$, open-circuit photovoltage ($V_{oc}$) 776 mV, fill factor (FF) 60.5% and light-to-electricity conversion efficiency of 2.6%. Measuring the photovoltaic performance of a DSSC prepared in the same way, but without wires, with the same illumination area of 9 $cm^2$, showed: short-circuit photocurrent ($J_{sc}$) of 1.2 $mA/cm^2$, open-circuit photovoltage ($V_{oc}$) 745 mV, fill factor (FF) 24.6% and light-to-electricity conversion efficiency of only 0.27%. These results show that the wires fabrication led to substantial improvement of both the fill factor and the photovoltaic efficiency.

REFERENCES

Grätzel, M., *Prog. Photovolt: Res. Appl.,* 2006, 14, 429-442

Späth, M. Sommeling, P. M. van Roosmalen, J. A. M. Smit, H. J. P. van der Burg, N. P. G. Mahieu, D. R. Bakker, N. J. Kroon, J. M., *Prog. Photovolt: Res. Appl.,* 2003, 11, 207-220

Tulloch, G. E., *J. Photochem. Photobiol. A: Chem.*, 2004, 164, 209-219

Kay, A. Grätzel, M., *Sol. Energy Mater. Sol. Cells,* 1996, 44, 99-117

Grätzel, M., Prog. Photovolt: Res. Appl., 2000, 8, 171-185

Arakawa, H. et al., Book of abstracts of 16th international conference on photochemical conversion and storage of solar energy, Uppsala, Sweden, Jul. 2-7, 2006, W4-P-10

Goto, K. Kawashima, T. Tanabe, N., *Sol Energy Mater Sol Cells,* 2006, 90, 3251-3260

Dai, S. Wang, K. Weng, J. Sui, Y. Huang, Y. Xiao, S. Chen, S. Hu, L. Kong, F. Pan, X. Shi, C. Guo, L., *Sol. Energy Mater. Sol. Cells,* 2005, 85, 447-455

The invention claimed is:

1. A method for electrochemical or chemical deposition of a metal or an alloy on a transparent conductive oxide (TCO) surface, comprising:
   a) electrochemically reducing an upper layer of the TCO surface with a first electrolyte consisting of at least one halide salt in water, at least one halide salt in a polar organic solvent, or a combination thereof, to yield a reduced upper TCO layer, wherein the TCO is selected from the group consisting of indium oxide doped by tin (ITO) and fluorine-doped tin oxide (FTO); and
   b) electrochemically or electrolessly depositing said metal or alloy on the reduced upper layer of the TCO surface with a second electrolyte comprising at least one metal compound if depositing said metal, or comprising at least two metal compounds if depositing said alloy.

2. The method of claim 1, wherein said TCO is indium oxide doped by tin (ITO).

3. The method of claim 1, wherein said metal is Ni, Cu, Co, Fe, Pd, Pt or Sn, and said alloy is nickel-cobalt alloy, nickel-iron alloy, nickel-chromium-iron alloy, nickel-palladium alloy, nickel-tungsten alloy, nickel-tin alloy, nickel-molybdenum alloy, nickel-cobalt-rhenium alloy, nickel-ruthenium alloy or cobalt-tungsten alloy.

4. The method of claim 3, wherein said alloy is nickel-cobalt alloy.

5. The method of claim 1, wherein said electrochemical reduction is carried out in an electrochemical cell, wherein: (i) the TCO is connected to a cathodic polarity; and (ii) an anode is made of an inert insoluble conductive material.

6. The method of claim 5, wherein the anode is made of graphite, platinum, TCO or titanium coated with platinum.

7. The method of claim 5, wherein said polar organic solvent is a $C_1$-$C_6$ alkanol.

8. The method of claim 1, further comprising etching a reduced metal obtained in the reduction step (a) prior to electrochemical or electroless deposition of said metal or metal alloy on the reduced upper TCO surface.

9. The method of claim 8, wherein the etching of said reduced metal is carried out in an acid or base solution, or in a solution of an oxidating agent together with a complexing agent.

10. The method according to claim 5, wherein said polar organic solvent is ethanol.

11. The method according to claim 1, wherein the polar organic solvent is a $C_1$-$C_6$ alkanol.

* * * * *